(12) United States Patent
Hayashi (10) Patent No.: US 10,416,743 B2
(45) Date of Patent: Sep. 17, 2019

(54) POWER SUPPLY SYSTEM

(71) Applicant: NEC Corporation, Minato-ku, Tokyo (JP)

(72) Inventor: Toshiyuki Hayashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/891,562

(22) Filed: Feb. 8, 2018

(65) Prior Publication Data

US 2018/0275733 A1 Sep. 27, 2018

(30) Foreign Application Priority Data

Mar. 23, 2017 (JP) .................................. 2017-057265

(51) Int. Cl.
| | | |
|---|---|---|
| G06F 1/26 | (2006.01) | |
| H05K 7/14 | (2006.01) | |
| H02J 9/06 | (2006.01) | |
| G06F 1/18 | (2006.01) | |

(52) U.S. Cl.
CPC .............. *G06F 1/266* (2013.01); *G06F 1/189* (2013.01); *H02J 9/061* (2013.01); *H05K 7/1492* (2013.01)

(58) Field of Classification Search
CPC ......... G06F 1/266; H02J 9/061; H05K 7/1492
USPC ....................................................... 361/624
See application file for complete search history.

(56) References Cited

U.S. PATENT DOCUMENTS

| | | | | | |
|---|---|---|---|---|---|
| 3,665,495 A | * | 5/1972 | Carter | ...................... | H02J 9/066 290/4 R |
| 4,467,220 A | * | 8/1984 | Page | ........................ | H02B 1/24 307/112 |
| 6,018,233 A | * | 1/2000 | Glennon | .................. | F02N 11/04 290/36 R |
| 6,150,736 A | * | 11/2000 | Brill | .......................... | H02J 3/38 307/19 |
| 6,496,342 B1 | * | 12/2002 | Horvath | ................. | H02H 7/261 361/62 |
| 6,538,345 B1 | * | 3/2003 | Maller | .................... | H02J 9/061 307/64 |
| 6,714,022 B2 | * | 3/2004 | Hoffman | .................. | H02H 7/04 324/547 |
| 7,203,622 B2 | * | 4/2007 | Pan | ........................... | H02J 3/00 702/184 |
| 7,265,458 B2 | * | 9/2007 | Edelen | ..................... | H02J 9/06 307/65 |
| 7,388,303 B2 | * | 6/2008 | Seiver | ..................... | H02J 3/005 174/70 B |

(Continued)

FOREIGN PATENT DOCUMENTS

| | | |
|---|---|---|
| JP | 2007-181258 A | 7/2007 |
| JP | 2008-258961 A | 10/2008 |

(Continued)

OTHER PUBLICATIONS

Japanese Office Action for JP Application No. 2017-057265 dated Oct. 24, 2017 with English Translation.

*Primary Examiner* — Anatoly Vortman (57) ABSTRACT

A power supply system includes two first power paths for supplying electric power to a first device, and two second power paths for supplying electric power to a second device. One of the first power paths is configured to be able to supply power to the second device, and one of the second power paths is configured to be able to supply power to the first device.

8 Claims, 10 Drawing Sheets

(56) References Cited

U.S. PATENT DOCUMENTS

| | | | | |
|---|---|---|---|---|
| 7,477,506 | B2* | 1/2009 | Salamanca Segoviano | ................ H02B 5/06 361/602 |
| 8,212,401 | B2* | 7/2012 | Linkhart | ................... H02J 9/06 307/64 |
| 8,294,297 | B2* | 10/2012 | Linkhart | ................... H02J 9/06 307/64 |
| 8,754,544 | B2* | 6/2014 | Colombi | ................ H02J 3/005 307/64 |
| 9,041,250 | B1* | 5/2015 | Czamara | ................... H02J 3/14 307/64 |
| 9,337,688 | B2* | 5/2016 | Englert | ..................... H02J 9/04 |
| 9,342,414 | B1* | 5/2016 | Nguyen | .............. G06F 11/2015 |
| 9,362,769 | B2* | 6/2016 | Zhou | .................... H01M 10/44 |
| 9,484,771 | B2* | 11/2016 | Braylovskiy | ............ H02J 9/061 |
| 10,014,713 | B1* | 7/2018 | Nguyen | .................. H02J 9/061 |
| 2012/0098337 | A1* | 4/2012 | Sasaki | ...................... H02J 1/12 307/23 |
| 2013/0293017 | A1* | 11/2013 | Englert | ..................... H02J 9/04 307/65 |
| 2014/0035367 | A1 | 2/2014 | Kohri | |

FOREIGN PATENT DOCUMENTS

| | | |
|---|---|---|
| JP | 2011-081716 A | 4/2011 |
| JP | 2013-070551 A | 4/2013 |
| JP | 2014-029642 A | 2/2014 |
| JP | 2015-060333 A | 3/2015 |
| JP | 2016-127726 A | 7/2016 |
| JP | 2017-004191 A | 1/2017 |

* cited by examiner

| PATTERN | POWER CONSUMPTION OF SERVER A | POWER CONSUMPTION OF SERVER B | POWER CAPPING SETTING OF SERVER A | POWER CAPPING SETTING OF SERVER B | CORRESPONDING DRAWINGS |
|---|---|---|---|---|---|
| 1 | A≦1000W | B≦1000W | NO | NO | FIG. 2 |
| 2 | 1000W<A≦2000W | B≦1000W | NO | NO | FIG. 2 |
| 3 | A>2000W | B≦1000W | NO | 1000W | FIG. 4 |
| 4 | A≦1000W | 1000W<B≦2000W | NO | NO | FIG. 2 |
| 5 | A≦1000W | B>2000W | 1000W | NO | FIG. 5 |
| 6 | 1000W<A≦2000W | 1000W<B≦2000W | 2000W | 2000W | FIG. 2 |

POWER SUPPLY SYSTEM

INCORPORATION BY REFERENCE

The present invention is based upon and claims the benefit of priority from Japanese patent application No. 2017-057265, filed on Mar. 23, 2017, the disclosure of which is incorporated herein in its entirety by reference.

TECHNICAL FIELD

The present invention relates to a power supply system, and in particular, to a power supply system that supplies electric power to a plurality of devices.

BACKGROUND ART

In an information processing system such as a rack system having a plurality of servers, a technology of supplying electric power to servers with use of a bus bar has been known. In that case, electric power can be supplied to a plurality of servers from a central DC power source via a bus bar. This provides an advantage of suppressing conversion loss from DC to AC. As a distance between the bus bar and a server depends on the depth of the server, the bus bar and the server are connected with each other by a power feeder cable.

Meanwhile, due to improvements in the capacity and high density mounting of servers in recent years, power consumption of each server stored in the rack may be increased. In the case of supplying DC power to such a server, there is a problem that a large amount of electric power cannot be supplied to the server in the conventional DC power supply system due to the specification of a connector of a bus bar or the specification of a direct current (DC) power feeder cable.

In order to solve the aforementioned problem, a connector of a bus bar may be changed to that of a large type having higher power supply capacity. However, when a bus bar is changed, there is a problem that an existing power supply system cannot be used. Further, with use of a large-type connector, there is another problem that a connector mounting density on the bus bar is lowered.

Patent Literature 1: JP 2011-81716 A

As a configuration of supplying a large amount of electric power to a server, there is a technology disclosed in Patent Literature 1. Patent Literature 1 discloses a configuration of supplying electric power by interchanging the power between a plurality of servers. Specifically, each of the servers has two power sources, and is configured such that electric power supplied from the two power sources can be supplied from one server to another server.

However, in the configuration of Patent Literature 1, when electric power is interchanged between servers, there is a problem that the power of a server on the power supply side may be in short, which may cause power outage in the server.

SUMMARY

In view of the above, an exemplary object of the present invention is to provide a power supply system capable of solving the aforementioned problem, that is, a problem that a power shortage may be caused in a device.

A power supply system, according to an exemplary aspect of the present invention, includes two first power paths for supplying electric power to a first device, and two second power paths for supplying electric power to a second device.

The power supply system is configured such that one of the first power paths is configured to be able to supply electric power to the second device, and one of the second power paths is configured to be able to supply electric power to the second device.

Further, a system, according to an exemplary aspect of the present invention, includes a first device to which electric power is supplied from two first power paths, and a second device to which electric power is supplied from two second power paths.

The system is configured such that one of the first power paths is configured to be able to supply electric power to the second device, and one of the second power paths is configured to be able to supply electric power to the second device.

Further, a power control method, according to an exemplary aspect of the present invention, is a power control method of a power supply system including two first power paths for supplying electric power to a first device and two second power paths for supplying electric power to a second device.

The method includes switching a destination of power supply by one of the first power paths to either the first device or the second device, and switching a destination of power supply by one of the second power paths to either the second device or the first device.

Further, a power control device, according to an exemplary aspect of the present invention, is a power control device of a power supply system including two first power paths for supplying electric power to a first device and two second power paths for supplying electric power to a second device.

The power control device is configured to switch a destination of power supply by one of the first power paths to either the first device or the second device, and switches a destination of power supply by one of the second power paths to either the second device or the first device.

Further, a program, according to an exemplary aspect of the present invention, is configured to cause a power control device of a power supply system including two first power paths for supplying electric power to a first device and two second power paths for supplying electric power to a second device, to perform a process of switching a destination of power supply by one of the first power paths to either the first device or the second device, and switching a destination of power supply by one of the second power paths to either the second device or the first device.

With the configurations described above, the present invention is able to solve occurrence of power shortage in a device.

EXEMPLARY EMBODIMENTS

First Exemplary Embodiment

Figure 1:
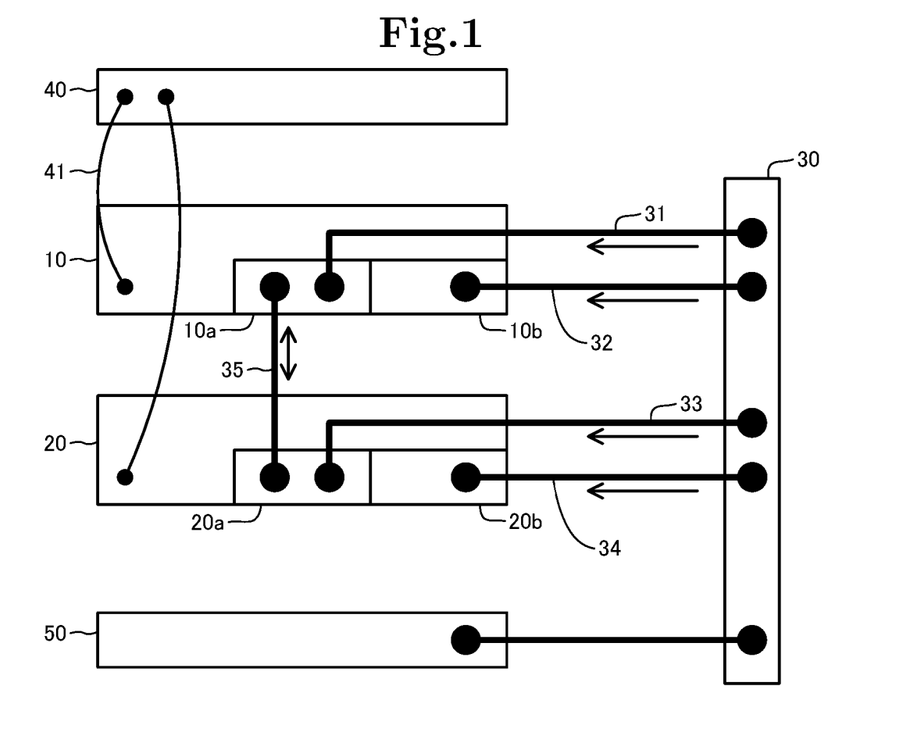
FIG. 1 is a diagram illustrating a schematic configuration of a system according to a first exemplary embodiment of the present invention.
Figure 2:
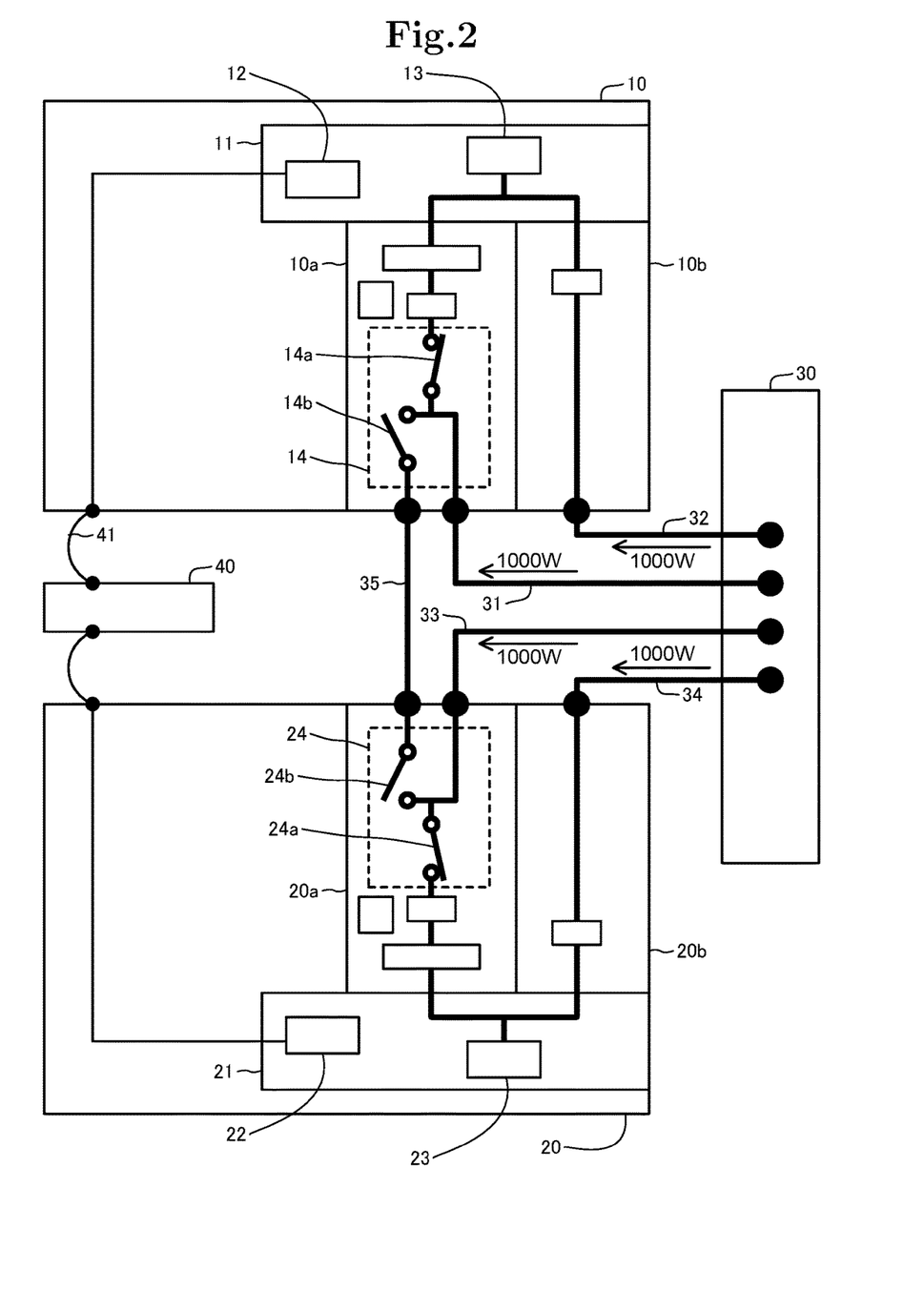
FIG. 2 is a diagram illustrating a configuration of the system according to the first exemplary embodiment of the present invention.
Figure 3:
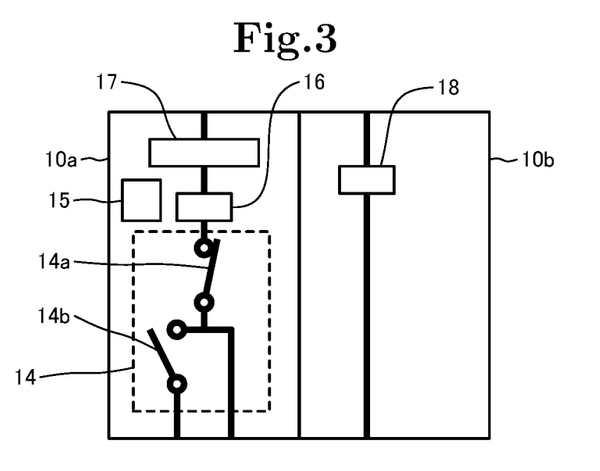
FIG. 3 illustrates a part of the configuration of the system disclosed in FIG. 2.

A first exemplary embodiment of the present invention will be described with reference to FIGS. 1 to 8. FIGS. 1 to 3 are diagrams for explaining a configuration of a system. FIGS. 4 to 7 are diagrams for explaining an operation of the system. FIG. 8 illustrates another exemplary configuration of the system.

[Outline of Configuration]

FIG. 1 illustrates a schematic configuration of a system according to the present invention. The system includes a server A 10 (first device) and a server B 20 (second device) arranged to be adjacent to each other, a DC central power source 50 and a bus bar 30 for supplying electric power to the servers A and B, and power feeder cables 31 to 34 connecting the bus bar 30 and the servers A and B. The server A 10 and the server B 20 are connected with each other by a power feeder cable 35, and are connected via a local area network (LAN) switch 40 and a LAN cable 41.

The servers A and B each are connected with two power feeder cables 31 to 34. This means that the server A 10 is connected with two power feeder cables 31 and 32 (first power paths), and the server B 20 is connected with two power feeder cables 33 and 34 (second power paths).

The servers A and B each include two power feeder modules 10a, 10b, 20a, and 20b. Specifically, the server A 10 includes the switch-equipped power feeder module 10a for the server A to which one power feeder cable 31 is connected, and the power feeder module 10b for the server A to which another power feeder cable 32 is connected. The server B 20 includes the switch-equipped power feeder module 20a for the server B to which one power feeder cable 33 is connected, and the power feeder module 20b for the server B to which another power feeder cable 34 is connected.

The switch-equipped power feeder modules 10a and 20a of the respective servers A and B are connected with each other by the power feeder cable 35. Thereby, power is interchangeable between the servers A and B. In particular, the present invention is configured such that only the power supplied from one power feeder cable 31 or 33, of the two power feeder cables connected to each of the servers A and B, is interchanged between the servers A and B. Accordingly, while maintaining a state where the power is supplied to the respective servers A and B from the other power feeder cables 32 and 34, the power supplied from one power feeder cable 31 or 33 can be supplied to the other adjacent server A or B in which power may be insufficient.

Here, the system of the present invention is a rack system having a plurality of stages of racks arranged in a data center. In this case, the rack system contains the server A 10, the server B 20, the central power source 50, the LAN switch 40, and the like, on the respective stages of the rack. However, the system of the present invention may have any configuration.

Further, while description is given in the present embodiment that a server, that is an information processing apparatus, is an object to which electric power is supplied, an object to which the power is supplied in the present invention may be any device without any limitation to a server.

[Configuration]

Next, a detailed configuration of the system will be described with reference to FIG. 2. As described above, the system includes two servers A 10 and B 20 connected with the power feeder cables 31 to 34 extending from the bus bar 30. It should be noted that DC power is supplied from the bus bar 30 to each of the servers A and B.

The server A 10 is connected with two power feeder cables 31 and 32 for the server A, extending from the bus bar 30. The server A 10 includes the switch-equipped power feeder module 10a for the server A to which one power feeder cable 31 is connected, and the power feeder module 10b for the server A to which the other power feeder cable 32 is connected. The server A 10 is able to receive power from the respective power feeder cables 31 and 32.

Similarly, the server B 20 is connected with two power feeder cables 33 and 34 for the server B, extending from the bus bar 30. The server B 20 includes the switch-equipped power feeder module 20a for the server B to which one power feeder cable 33 is connected, and the power feeder module 20b for the server B to which the other power feeder cable 32 is connected. The server B20 is able to receive power from the respective power feeder cables 33 and 34.

The switch-equipped power feeder module 10a for the server A of the server A 10 and the switch-equipped power feeder module 20a for the server B of the server B 20 are connected with each other via the power feeder cable 35. Thereby, the supplied power is interchangeable between the server A10 and the server B 20 via the power feeder cable 35.

Further, as illustrated in FIG. 2, the server A 10 includes a baseboard management controller (BMC) 12 mounted on a motherboard 11, and a loading device 13 such as an arithmetic unit. The BMC 12 is a control device that manages the server A. As described below, the BMC 12 controls a power supply state by the switch-equipped power feeder module 10a for realizing power interchange between the servers A and B. Similarly, the server B 20 includes a BMC 22 mounted on a motherboard 21, and a loading device 23 such as an arithmetic unit. It should be noted that the details of the functions of the BMC 12 and 22 will be described below.

Next, configurations of the switch-equipped power feeder module 10a for the server A and the power feeder module 10b for the server A will be described with reference to FIG. 3. As the power feeder module 10b for the server A is connected with the other power feeder cable 32 for the server A as described above, the power feeder module 10b is able to receive power constantly from the other power feeder cable 32.

The power feeder module 10b for the server A includes a power sensor 18 that detects power consumption of the loading device 13 by detecting the electric energy of the power path to which the loading device 13 is connected. The power consumption detected by the power sensor 18 is monitored by the BMC 12.

The switch-equipped power feeder module 10a for the server A includes a switch 14 disposed between the one power feeder cable 31 for the server A and the loading device 13. The switch 14 is connected with a switch 24 of the switch-equipped power feeder module 20a for the server B of the server B 20, via the power feeder cable 35.

Figure 5:
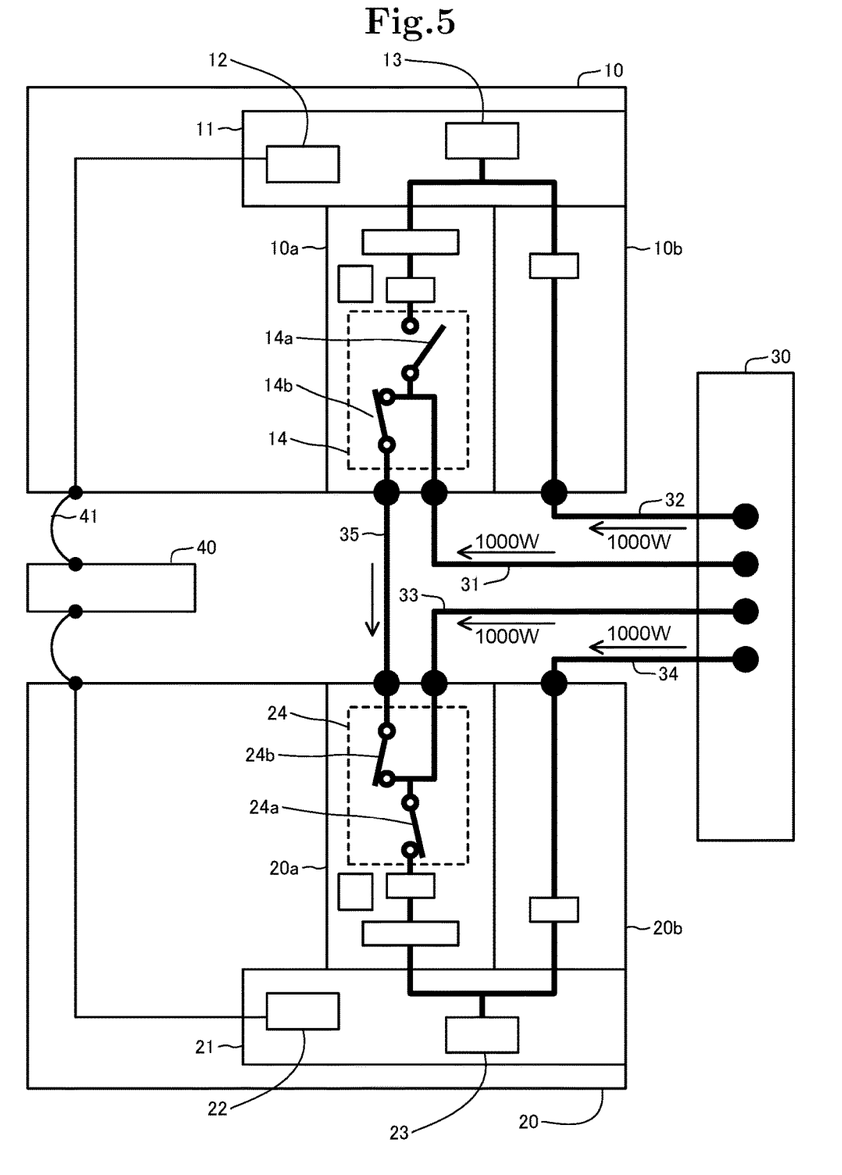
FIG. 5 illustrates an operation of the system disclosed in FIG. 2.

The switch 14 includes two switching circuits 14a and 14b, and switches a connecting state in two ways as described below by opening and closing them. One state is a state where power from the one power feeder cable 31 for the server A is supplied to the loading device 13 of the server A, as illustrated in FIG. 2. The other state is a state where the one power feeder cable 31 for the server A is connected with the switch 24 mounted on the server B, and the power from the one power feeder cable 31 for the server A is supplied to the loading device 23 of the server B, as illustrated in FIG. 5.

The switch-equipped power feeder module 10a for the server A also includes a controller 15, a power sensor 16, and a capacitor 17. The power sensor 16 detects power consumption of the loading device 13 by detecting the electric energy of the power path to which the loading device 13 is connected. The power consumption detected by the power sensor 16 is monitored by the BMC 12. The controller 15 performs switching between opened and closed states of the switching circuits 14a and 14b of the switch 14, according to a control command from the BMC 12. The capacitor 17 is a device for storing power such that power, insufficient in the server A, can be supplied to the server A when the switch 14 is switched.

The power feeder module 20b for the server B and the switch-equipped power feeder module 20a for the server B of the server B 20 have the same configurations as those of the server A 10. This means that as the power feeder module 20b for the server B is connected with the other power feeder cable 34 for the server B, and the power feeder module 20b is able to receive power constantly from the other power feeder cable 34. Further, the power feeder module 20b for the server B includes a power sensor that detects power consumption of the loading device 23, and the power consumption detected by the power sensor is monitored by the BMC 22.

The switch-equipped power feeder module 20a for the server B has the same configuration as the switch-equipped power feeder module 10a for the server A. The means that the switch 24 of the switch-equipped power feeder module 20a for the server B includes two switching circuits 24a and 24b, and switches a connecting state in two ways as described below by opening and closing them. One state is a state where power from the one power feeder cable 33 for the server B is supplied to the loading device 23 of the server B. The other state is a state where the one power feeder cable 33 for the server B is connected with the switch 14 mounted on the server A, and the power from the one power feeder cable 33 for the server B is supplied to the loading device 13 of the server A.

The switch-equipped power feeder module 20a for the server B also includes a controller, a power sensor, and a capacitor. The power sensor detects power consumption of the loading device 23, which is monitored by the BMC 22.

Next, a detailed configuration of the BMC 12 (control device) mounted on the server A 10 will be described. The BMC 12 reads detection values detected by the two power sensors 16 and 18 mounted on the server A10 to thereby detect the power consumption of the loading device 13 of the server A 10. Further, the BMC 12 accesses the BMC 22 mounted on the adjacent server B 20 via a LAN to thereby detect power consumption of the loading device 23 of the server B detected by the BMC 22 of the server B 20.

Then, the BMC 12 outputs a command to control the respective switches 14 and 24 of the server A 10 and the server B 20, based on the power consumption of the server A 10 and the server B 20. This means that the BMC 12 controls the switches 14 and 24 to switch the destination of the power supply by the one power feeder cable 31 for the server A, to the server A or the server B, or controls the switches 24 and 14 to switch the destination of the power supply by the one power feeder cable 33 for the server B, to the server B or the server A.

For example, the BMC 12 controls the switches 14 and 24 when the power consumption of the server A or the server B is as described below. First, it is assumed that the destination of the power supply by the one power feeder cable 31 for the server A is the server A, and the destination of the power supply by the one power feeder cable 33 for the server B is the server B. In this case, when the power consumption of the server A exceeds the electric energy available from the two power feeder cables 31 and 32 for the server A, or when the power consumption of the server B exceeds the electric energy available from the two power feeder cables 33 and 34 for the server B, the BMC 12 controls the switches 14 and 24. Specifically, the BMC 12 operates the switches 14 and 24 so as to supply power fed by the one power feeder cables 31 and 33 for the servers A and B, to the server in which power consumption exceeds the electric energy available from the two power feeder cables (31 and 32, or 33 and 34).

At that time, the BMC 12 performs power capping by setting an upper limit value of the power consumption of the server A 10 or the server B 20. For example, the BMC 12 sets an upper limit value of the power consumption of the server A or the server B such that the total power consumption of the server A and the server B does not exceed the total electric energy available from the two power feeder cables 31 and 32 for the server A and the two power feeder cables 33 and 34 for the server B. As an example, an upper limit value of the power consumption of the server A is set to a value of the electric energy available from the other power feeder cable 32 for the server A. Alternatively, an upper limit value of the power consumption of the server B is set to a value of the electric energy available from the other power feeder cable 34 for the server B. It should be noted that power capping may be performed on both the servers A and B.

In a state of supplying power, to the server A or the server B, by both the one power feeder cables 31 and 33 for the respective servers A and B, when the power consumption of the server A or the server B drops, the BMC 12 operates the switches 14 and 24 to restore the destination of the power supply by the one power feeder cables 31 and 33 to the original. This means that when the power consumption of the server A becomes lower than the electric energy available from the two power feeder cables 31 and 32 for the server A, the BMC 12 sets the destination of the power supply by the one power feeder cable 31 for the server A to the server A, and sets the destination of the power supply by the one power feeder cable 33 for the server B to the server B. Similarly, when the power consumption of the server B becomes lower than the electric energy available from the two power feeder cables 33 and 34 for the server B, the BMC 12 sets the destination of the power supply by the one power feeder cable 31 for the server A to the server A, and sets the destination of the power supply by the one power feeder cable 33 for the server B to the server B.

It should be noted that monitoring of the power consumption and switching control of the switches 14 and 24 by the BMC 12 may be performed by the BMC 22 mounted on the server B 20.

[Operation]

Next, an operation of power control by the system will be described with reference to FIGS. 2 and 4 to 7.

First, as a precondition, it is assumed that 1000 W of power is supplied from each of the power feeder cables 31 and 32 for the server A connected with the server A 10, and that 1000 W of power is supplied from each of the power feeder cables 33 and 34 for the server B connected with the server B 20, as illustrated in FIG. 2.

In the aforementioned state, it is assumed that the upper limit of the total power consumption available to the servers A and B is 4000 W. It is also assumed that in a state of not interchanging the power, the servers A and B can use only the power supplied from the bus bar 30. This means that when the power supply from the bus bar 30 to each of the power feeder modules 10a, 10b, 20a, and 20b is 1000 W, the servers A and B each can use up to 2000 W.

Further, in a state of interchanging the power, when power is accommodated from the server B to the server A, the upper limit value of the power consumption of the server A is 3000 W, and the upper limit value of the server B is 1000 W. On the contrary, when power is accommodated from the server A to the server B, the upper limit value of the power consumption of the server A is 1000 W, and the upper limit value of the power consumption of the server B is 3000 W. Further, the power consumption of each of the servers A and B is assumed not to exceed 3000 W regardless of the power interchanging state.

It should be noted that the aforementioned power supply amount and the power consumption of the respective servers A and B, described below, are examples. The present invention is applicable in any values.

Figure 6:
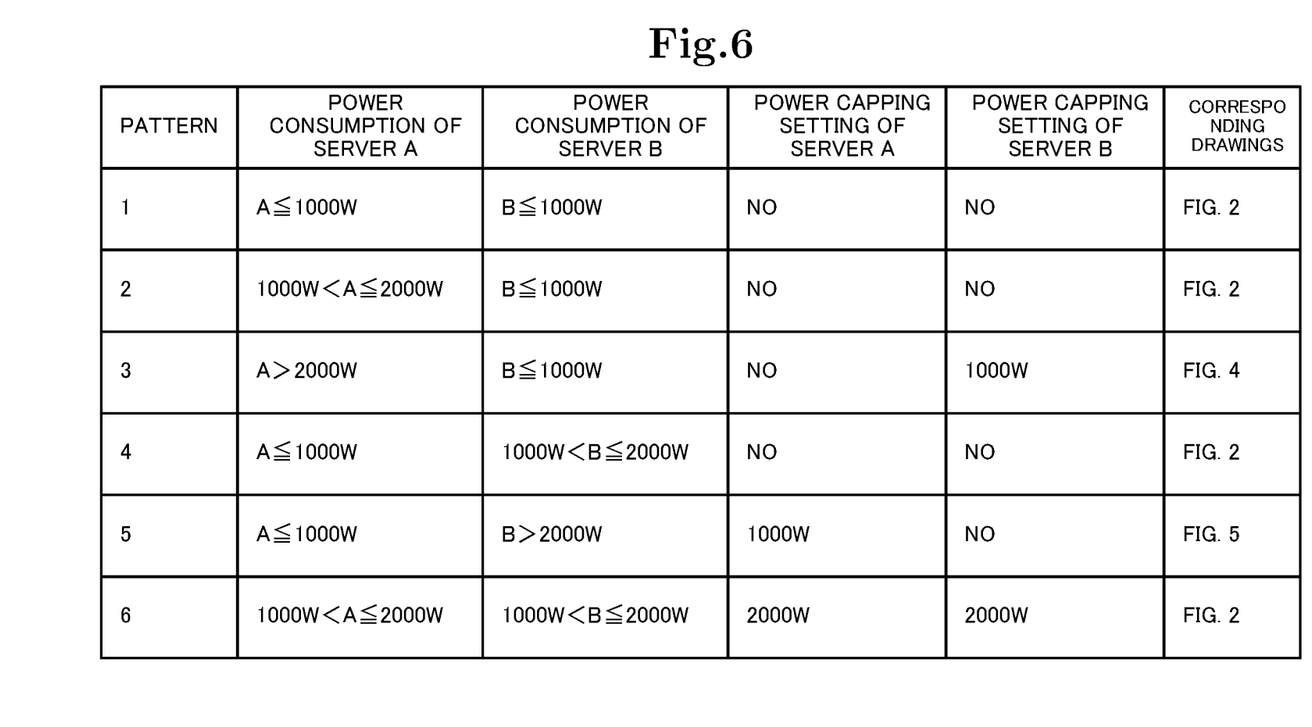
FIG. 6 illustrates states of power control in the system disclosed in FIG. 2.
Figure 7A:
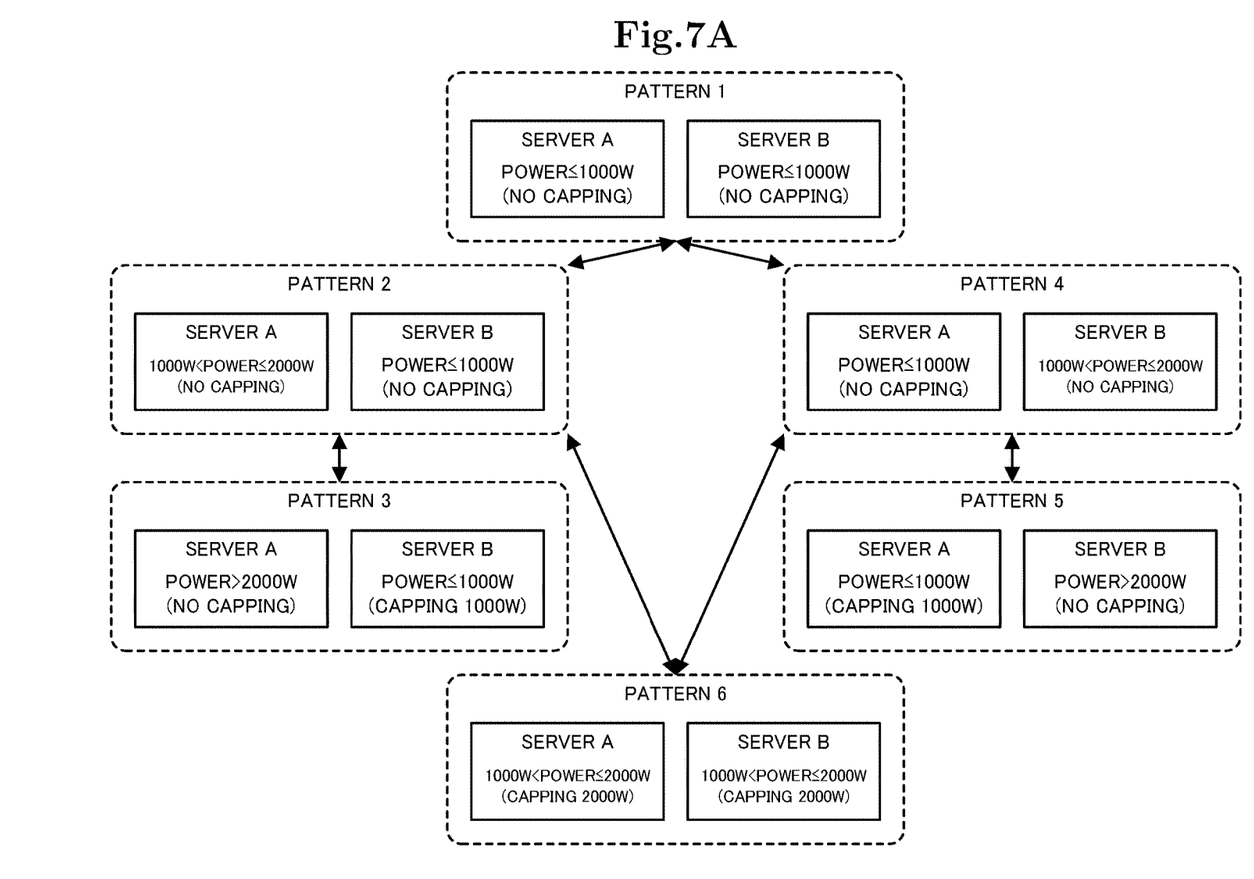
FIG. 7A illustrates states of power control in the system disclosed in FIG. 2.
Figure 7B:
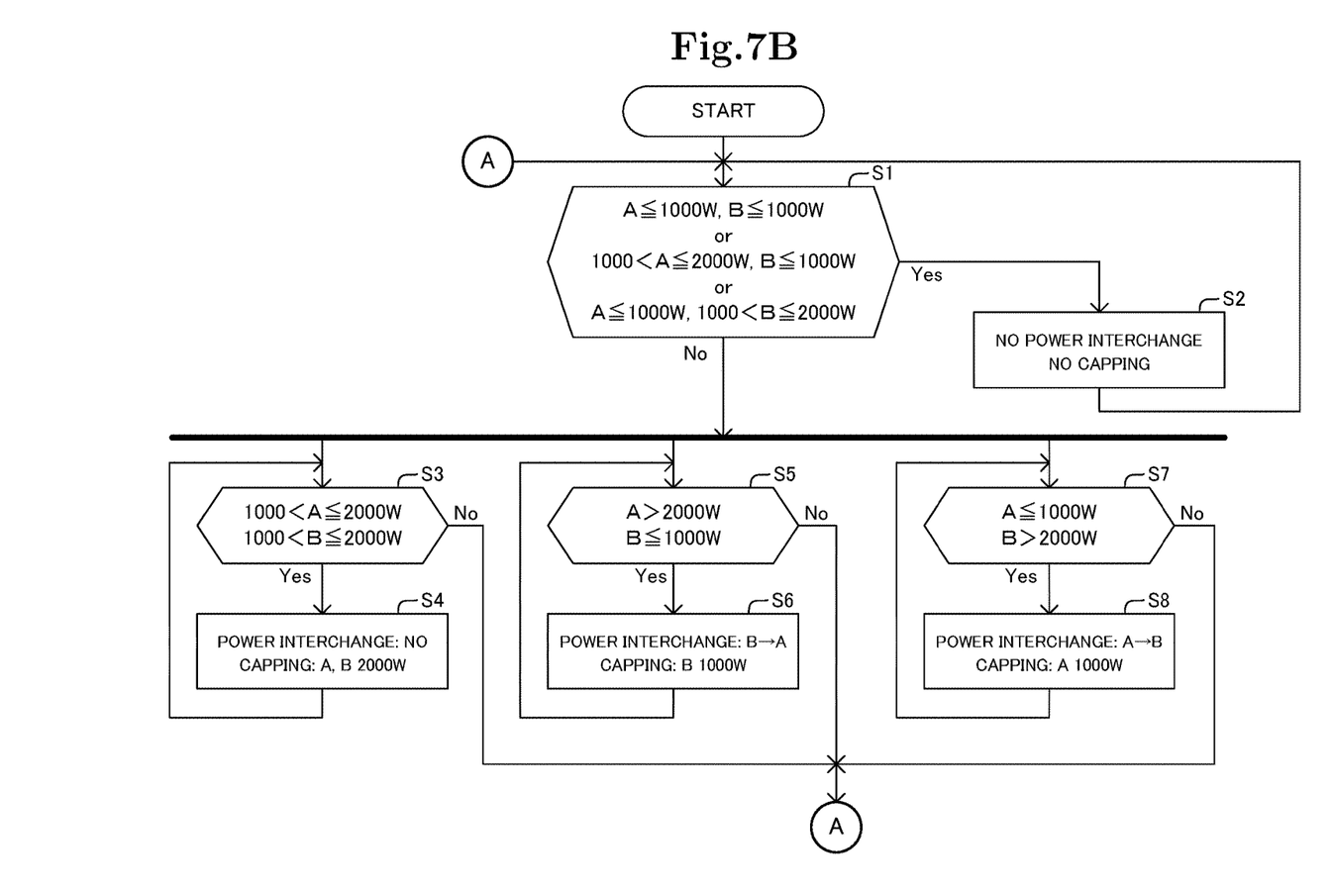
FIG. 7B is a flowchart illustrating an operation of power control in the system disclosed in FIG. 2.
Figure 8:
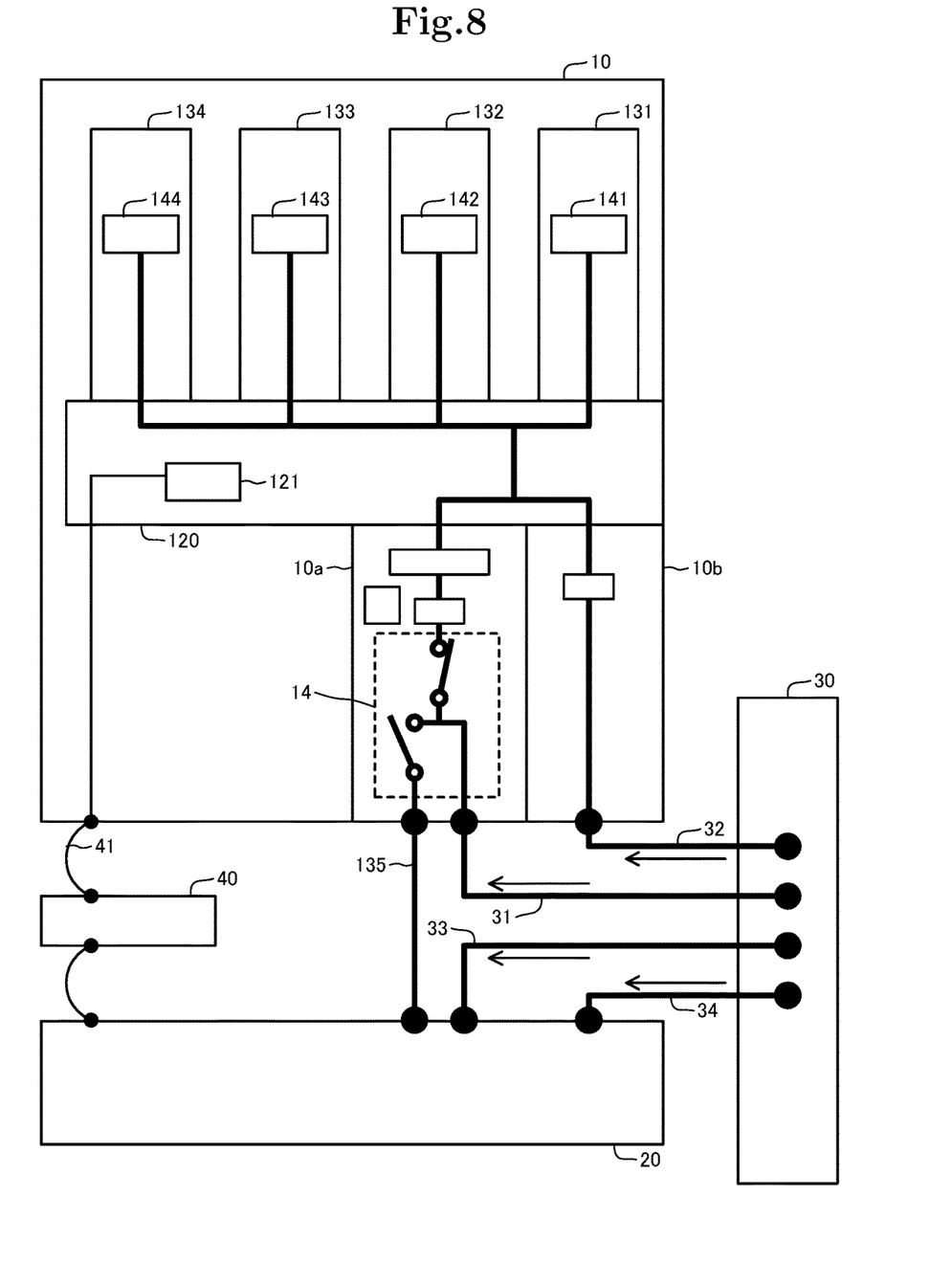
FIG. 8 is a diagram illustrating another exemplary configuration of the system disclosed in FIG. 2.

First, as illustrated in a pattern 1 of FIGS. 6 and 7A, the power consumption of each of the servers A and B monitored by the BMC 12 is in a state of "power ≤1000 W" (Yes at step S1 of FIG. 7B). In this case, the switches 14 and 24 in the switch-equipped power feeder modules 10a and 20a are in a state illustrated in FIG. 2 (step S2 of FIG. 7B). This means that to the server A, the power of 2000 W in total is supplied from the two power feeder cables 31 and 32 for the server A, and to the server B, the power of 2000 W in total is supplied from the two power feeder cables 33 and 34 for the server B.

From the aforementioned state, it is assumed that the power consumption of the server A rises to "1000 W<power ≤2000 W", and the power consumption of the server B does not rise and remains in the state of "power ≤1000 W" (Yes at step S1 of FIG. 7B). This state is a pattern 2 of FIGS. 6 and 7A, but the switches 14 and 24 are not operated, and remain in the state of FIG. 2 (step S2 of FIG. 7B).

Then, it is assumed that the power consumption of the server A further rises to "power >2000 W", and the power consumption of the server B does not rise and remains in the state of "power ≤1000 W" (No at step S1 and Yes at step S5 of FIG. 7B). This case is a pattern 3 of FIGS. 6 and 7A. The switches 14 and 24 in the switch-equipped power feeder modules 10a and 20a are in a state illustrated in FIG. 4 (step S6 of FIG. 7B). This means that the switches 14 and 24 are operated such that the destination of the power supply by the one power feeder cable 33 for the server B is switched to the server A, and the power is accommodated from the server B to the server A. Thereby, power is supplied to the server A from the three power feeder cables 31, 32, and 33.

Figure 4:
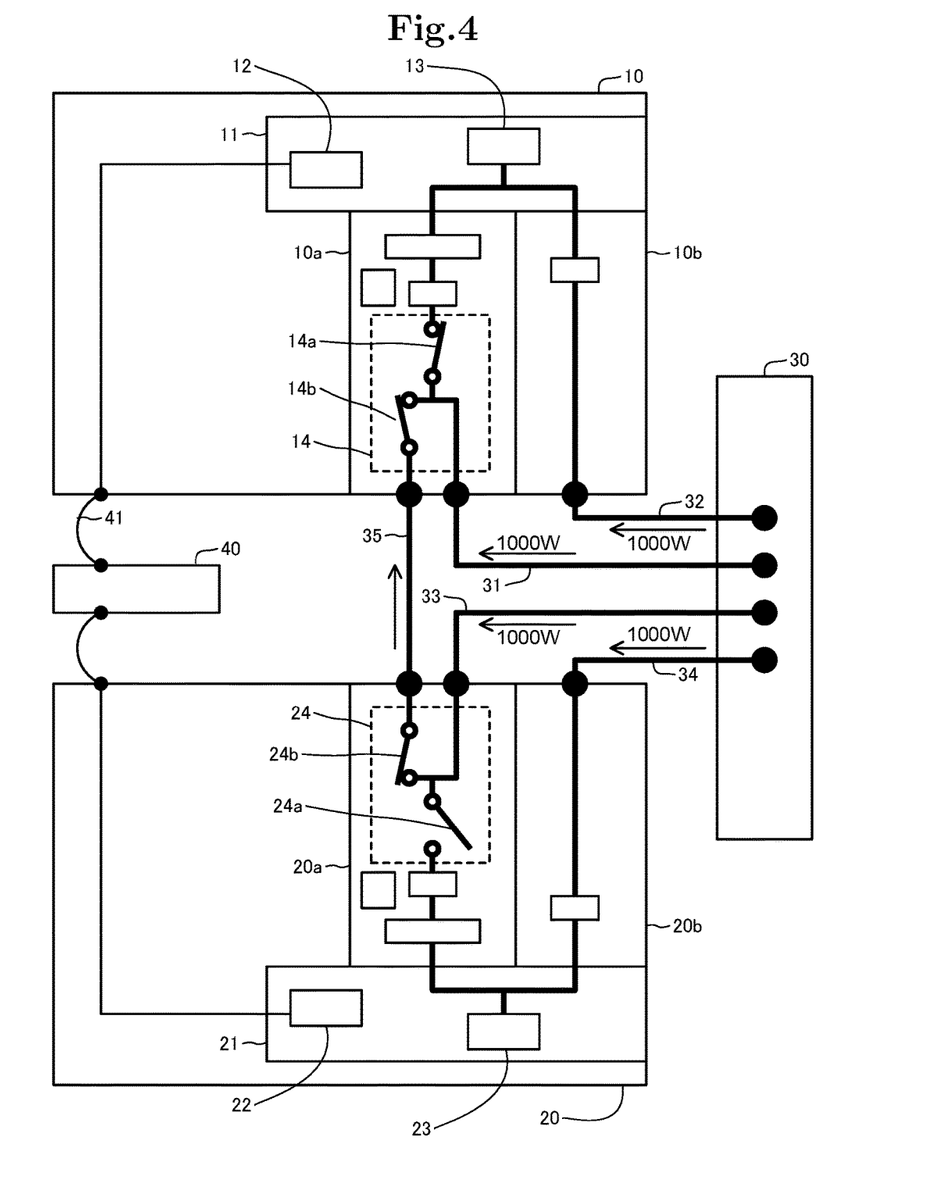
FIG. 4 illustrates an operation of the system disclosed in FIG. 2.

At this time, as the power consumption of the server A exceeds the electric energy available from the two power feeder cables 31 and 32 for the server A, power capping is performed by setting the upper limit value of the power consumption of the server B 20 to 1000 W. At this time, it is also possible to perform power capping by setting the upper limit value of the power consumption of the server A to 3000 W. This means that control is performed such that the power consumption of the both servers A and B does not exceed the entire power supply amount.

When the power consumption of the server A exceeds 2000 W in the pattern 2, the switches 14 and 24 are operated to become a state of the pattern 3. However, operation of the switches 14 and 24 takes a millisecond to a microsecond. During this time, the power consumption of the server A temporarily exceeds 2000 W. However, with the power stored in the capacitor 17, the server A operates normally.

Further, from the state of the pattern 2, when only the power consumption of the server B rises to "1000 W<power ≤2000 W" (No at step S1 and Yes at step S3 of FIG. 7B), the state becomes a pattern 6 of FIGS. 6 and 7A (step S4 of FIG. 7B). In this case, the switches 14 and 24 in the switch-equipped power feeder modules 10a and 20a remain in the state illustrated in FIG. 2. At this time, even if the power consumption of the server A or the server B rises to 2000 W or higher, power is not interchangeable. Therefore, power capping is performed by setting the upper limit value of each of the servers A and B to 2000 W.

Further, from the pattern 3, when the power consumption of the server A drops to a state of "1000 W<power ≤2000 W" or "power ≤1000 W" and the power consumption of the server B does not rise and remains in "power ≤1000 W" (No at step S5 and Yes at step S1 of FIG. 7B), the state returns to the pattern 2 or the pattern 1 (step S2 of FIG. 7B). At this time, accommodation of power from the server B to the server A in the pattern 3 is released, and the switches 14 and 24 in the switch-equipped power feeder modules 10a and 20a return from the state illustrated in FIG. 4 to the state illustrated in FIG. 2.

Further, from the state of the pattern 1, it is assumed that the power consumption of the server B rises to "1000 W<power ≤2000 W", and the power consumption of the server A does not rise and remains in the state of "power ≤1000 W" (Yes at step S1 of FIG. 7B). This state is the pattern 4 of FIGS. 6 and 7A, but the switches 14 and 24 are not operated, and remain in the state of FIG. 2 (step S2 of FIG. 7B).

Then, it is assumed that the power consumption of the server B further rises to "power >2000 W", and the power consumption of the server A does not rise and remains in the state of "power ≤1000 W" (No at step S1 and Yes at step S7 of FIG. 7B). This state is a pattern 5 of FIGS. 6 and 7A. The switches 14 and 24 in the switch-equipped power feeder modules 10a and 20a become the state illustrated in FIG. 5 (step S8 of FIG. 7B). This means that the switches 14 and 24 are operated such that the destination of the power supply by the one power feeder cable 31 for the server A is switched to the server B, and the power is accommodated from the server A to the server B. Thereby, power is supplied to the server B from the three power feeder cables 32, 33, and 34.

At this time, as the power consumption of the server B exceeds the electric energy available from the two power feeder cables 33 and 34 for the server B, power capping is performed by setting the upper limit value of the power consumption of the server A 10 to 1000 W. At this time, it is also possible to perform power capping by setting the upper limit value of the power consumption of the server B to 3000 W.

Further, from the state of the pattern 4, when only the power consumption of the server A rises to "1000 W<power ≤2000 W" (No at step S1 and Yes at step S3 of FIG. 7B), the state becomes the pattern 6 of FIGS. 6 and 7A (step S4 of FIG. 7B). In this case, the switches 14 and 24 in the switch-equipped power feeder modules 10a and 20a remain in the state illustrated in FIG. 2. At this time, even if the power consumption of the server A or the server B rises to 2000 W or higher, power is not interchangeable. Therefore, power capping is performed by setting the upper limit value of each of the servers A and B to 2000 W.

Further, from the pattern 5, when the power consumption of the server B drops to a state of "1000 W<power ≤2000 W" or "power ≤1000 W" and the power consumption of the server A does not rise and remains in "power ≤1000 W" (No at step S7 and Yes at step S1 of FIG. 7B), the state returns to the pattern 4 or the pattern 1 (step S2 of FIG. 7B). At this time, accommodation of power from the server A to the server B in the pattern 5 is released, and the switches 14 and 24 in the switch-equipped power feeder modules 10a and 20a return to the state illustrated in FIG. 2.

Further, from the state of the pattern 6, when the power consumption of the server B drops to a state of "power ≤1000 W" (No at step S3 and Yes at step S1 of FIG. 7B), the state becomes the pattern 2 or the pattern 1, depending on the power consumption of the server A (step S2 of FIG. 7B). Similarly, from the state of the pattern 6, when the power consumption of the server A drops to a state of "power ≤1000 W" (No at step S3 and Yes at step S1 of FIG. 7B), the state becomes the pattern 4 or the pattern 1, depending on the power consumption of the server B (step S2 of FIG. 7B). In this case, the switches 14 and 24 in the switch-equipped power feeder modules 10a and 20a remain in the state illustrated in FIG. 2.

As described above, according to the present invention, the BMCs 12 and 22 monitor the power of the servers A and B adjacent to each other, and the power is interchanged through the power feeder cable 35 connecting the adjacent servers A and B with each other. Thereby, it is possible to increase power supply capacity to the servers A or B of larger power consumption, without changing the existing power supply system (bus bar, power feeder cables). In addition, as the respective servers A and B are in a state where power is constantly supplied from one power feeder cables 32 and 34, even in a state where power is interchanged as described above, it is possible to prevent power shortage in the respective servers A and B.

Here, a modification of the aforementioned system configuration will be described with reference to FIG. 8. A system illustrated in FIG. 8 has a configuration similar to that of the aforementioned system, but the configurations of the servers A and B are different. The server A 10 includes a plurality of motherboards 131 to 134 on which loading devices 141 to 144 are mounted, respectively. The server A 10 has a distribution board 120 for supplying power to the respective loading devices 141 to 144. The distribution board 120 has a chassis management controller (CMC) 121 having the same function as the BMC 12 described above.

Further, the server A 10 is connected with the server B 20 via the LAN switch 40 and the LAN cable 41. Although not illustrated, the server B 20 is also configured to include a plurality of loading devices.

Even with this configuration, the CMC 121 monitors the power consumption of the loading devices of the respective servers A and B and controls the connecting state of the switch 14, to thereby be able to interchange power through the power feeder cable 35 connecting the adjacent servers A and B with each other. Thereby, it is possible to increase the power supply capacity with respect to a server of larger power consumption. In addition, as power is constantly supplied to the respective servers A and B from the one power feeder cables 32 and 34, it is possible to prevent power shortage in the respective servers A and B.

Second Exemplary Embodiment

Figure 9:
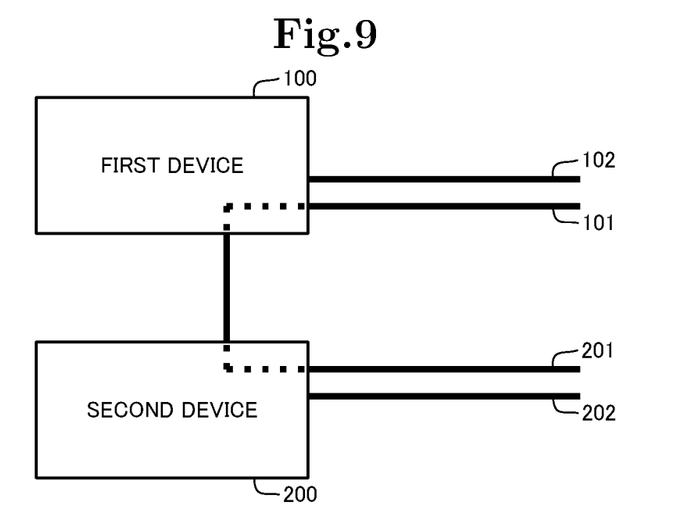
FIG. 9 is a diagram illustrating a configuration of a power supply system according to a second exemplary embodiment of the present invention.
Figure 10:
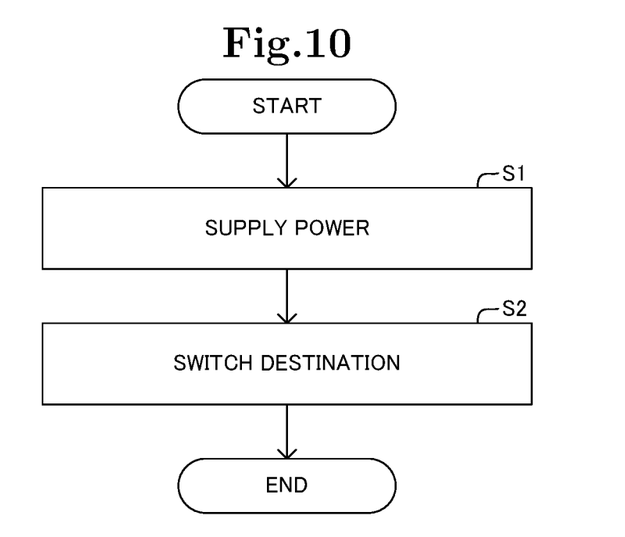
FIG. 10 is a diagram illustrating an operation of the power supply system according to the second exemplary embodiment of the present invention.

Next, a second exemplary embodiment of the present invention will be described with reference to FIGS. 9 and 10. FIG. 9 is a diagram illustrating a configuration of a system according to the second exemplary embodiment, and FIG. 10 illustrates the operation thereof. The system of the present embodiment illustrates a further outline of the system described in the first exemplary embodiment.

The system illustrated in FIG. 9 includes two first power paths 101 and 102 for supplying electric power to a first device 100, and two second power paths 201 and 202 for supplying electric power to a second device 200. One first power path 101 is configured to be able to supply power to the second device 200, and one second power path 201 is configured to be able to supply power to the first device 100.

According to this system, first, power is supplied to the first device 100 from the two first power paths 101 and 102, and power is supplied to the second device 200 from the two second power paths 201 and 202 (step S1). It is possible to switch the destination of the power supply by the one first power path 101 from the first device 100 to the second device 200, and switch the destination of the power supply by the one second power path 201 from the second device 200 to the first device 100 (step S2).

Therefore, power is interchangeable between the first device 100 and the second device 200, whereby it is possible to increase the power supply capacity with respect to a device of larger power consumption. In addition, while power is constantly supplied to each of the devices from one power path, it is possible to prevent power shortage in each of the devices.

Supplementary Notes

The whole or part of the exemplary embodiments disclosed above can be described as, but not limited to, the following supplementary notes. Hereinafter, outlines of the configurations of a power supply system, a system, a power control method, a power control device, and a program according to the present invention will be described. However, the present invention is not limited to the configurations described below.

(Supplementary Note 1)

A power supply system comprising:
two first power paths for supplying electric power to a first device; and
two second power paths for supplying electric power to a second device, wherein
one of the first power paths is configured to be able to supply electric power to the second device, and
one of the second power paths is configured to be able to supply electric power to the first device.

(Supplementary Note 2)

The power supply system according to supplementary note 1, further comprising a switch for switching a destination of power supply by the one of the first power paths to either the first device or the second device, and switching a destination of power supply by the one of the second power paths to either the second device or the first device.

(Supplementary Note 3)

The power supply system according to supplementary note 2, wherein the switch switches a state between a state in which the destination of the power supply by the one of the first power paths is set to the first device and the destination of the power supply by the one of the second power paths is set to the second device, and a state in which the destination of the power supply by the one of the first power paths and the one of the second power paths is set to either the first device or the second device.

(Supplementary Note 4)

The power supply system according to supplementary note 2 or 3, further comprising a control device that controls operation of the switch to switch the destination of the power supply by the one of the first power paths and the one of the second power path, based on power consumption of at least one of the first device and the second device.

(Supplementary Note 5)

The power supply system according to supplementary note 4, wherein in a state in which the destination of the power supply by the one of the first power paths is the first device and the destination of the power supply by the one of the second power paths is the second device, when the power consumption of the first device or the second device exceeds electric energy available from the two first power paths or the two second power paths, the control device controls the operation of the switch to switch the destination of the power supply by the one of the first power paths and the one of the second power paths to either the first device or the second device.

(Supplementary Note 6)

The power supply system according to supplementary note 4 or 5, wherein in a state in which the destination of the power supply by the one of the first power paths and the one of the second power paths is either the first device or the second device, when the power consumption of the first device or the second device becomes lower than electric energy available from the two first power paths or the two second power paths, the control device controls the operation of the switch to switch the destination of the power supply by the one of the first power paths to the first device and switches the destination of the power supply by the one of the second power paths to the second device.

(Supplementary Note 7)

The power supply system according to any of supplementary notes 4 to 6, wherein the control device sets an upper limit value of the power consumption of at least one of the first device and the second device such that total power consumption of the first device and the second device does not exceed electric energy available from the two first power paths and the two second power paths.

(Supplementary Note 8)

The power supply system according to any of supplementary notes 4 to 7, wherein the control device sets an upper limit value of power consumption of the first device or the second device to a value of electric energy available from another one of the first power paths or another one of the second power paths.

(Supplementary Note 9)

A system comprising:

a first device to which electric power is supplied from two first power paths; and a second device to which electric power is supplied from two second power paths, wherein one of the first power paths is configured to be able to supply electric power to the second device, and one of the second power paths is configured to be able to supply electric power to the first device.

(Supplementary Note 10)

The system according to supplementary note 9, further comprising a switch for switching a destination of power supply by the one of the first power paths to either the first device or the second device, and switching a destination of power supply by the one of the second power paths to either the second device or the first device.

(Supplementary Note 10.1)

The system according to supplementary note 10, wherein the switch switches a state between a state in which the destination of the power supply by the one of the first power paths is set to the first device and the destination of the power supply by the one of the second power paths is set to the second device, and a state in which the destination of the power supply by the one of the first power paths and the one of the second power paths is set to either the first device or the second device.

(Supplementary Note 11)

The system according to supplementary note 10 or 10.1, further comprising a control device that controls operation of the switch to switch the destination of the power supply by the one of the first power paths and the one of the second power path, based on power consumption of at least one of the first device and the second device.

(Supplementary Note 11.1)

The system according to supplementary note 11, wherein in a state in which the destination of the power supply by the one of the first power paths is the first device and the destination of the power supply by the one of the second power paths is the second device, when the power consumption of the first device or the second device exceeds electric energy available from the two first power paths or the two second power paths, the control device controls the operation of the switch to switch the destination of the power supply by the one of the first power paths and the one of the second power paths to either the first device or the second device.

(Supplementary Note 11.2)

The system according to supplementary note 11 or 11.1, wherein in a state in which the destination of the power supply by the one of the first power paths and the one of the second power paths is either the first device or the second device, when the power consumption of the first device or the second device becomes lower than electric energy available from the two first power paths or the two second power paths, the control device controls the operation of the switch to switch the destination of the power supply by the one of the first power paths to the first device and switch the destination of the power supply by the one of the second power paths to the second device.

(Supplementary Note 11.3)

The system according to any of supplementary notes 11 to 11.2, wherein the control device sets an upper limit value of the power consumption of at least one of the first device and the second device such that total power consumption of the first device and the second device does not exceed electric energy available from the two first power paths and the two second power paths.

(Supplementary Note 11.4)

The system according to any of supplementary notes 11 to 11.3, wherein the control device sets an upper limit value of the power consumption of the first device or the second device to a value of electric energy available from another one of the first power paths or another one of the second power paths.

(Supplementary Note 12)

The system according to any of supplementary notes 9 to 11.4, further comprising:

a first server that is the first device;

a second server that is the second device; and a rack in which the first server, the second server, and a power supply device that supplies electric power via the first power paths and the second power paths are stored.

(Supplementary Note 13)

A power control method of a power supply system, the power supply system including two first power paths for supplying electric power to a first device and two second power paths for supplying electric power to a second device, the method comprising switching a destination of power supply by one of the first power paths to either the first device or the second device, and switching a destination of power supply by one of the second power paths to either the second device or the first device.

(Supplementary Note 14)

The power control method according to supplementary note 13, further comprising switching a state between a state in which the destination of the power supply by the one of the first power paths is set to the first device and the destination of the power supply by the one of the second power paths is set to the second device, and a state in which the destination of the power supply by the one of the first power paths and the one of the second power paths is set to either the first device or the second device.

(Supplementary Note 15)

The power control method according to supplementary note 13 or 14, further comprising switching the destination of the power supply by the one of the first power paths and the one of the second power path, based on power consumption of at least one of the first device and the second device.

(Supplementary Note 16)

The power control method according to supplementary note 15, further comprising in a state in which the destination of the power supply by the one of the first power paths is the first device and the destination of the power supply by the one of the second power paths is the second device, when the power consumption of the first device or the second device exceeds electric energy available from the two first power paths or the two second power paths, switching the destination of the power supply by the one of the first power paths and the one of the second power paths to either the first device or the second device.

(Supplementary Note 17)

The power control method according to supplementary note 15 or 16, further comprising in a state in which the destination of the power supply by the one of the first power paths and the one of the second power paths is either the first device or the second device, when the power consumption of the first device or the second device becomes lower than electric energy available from the two first power paths or the two second power paths, switching the destination of the power supply by the one of the first power paths to the first device and switching the destination of the power supply by the one of the second power paths to the second device.

(Supplementary Note 18)

The power control method according to any of supplementary notes 15 to 17, further comprising setting an upper limit value of the power consumption of at least one of the first device and the second device such that total power consumption of the first device and the second device does not exceed electric energy available from the two first power paths and the two second power paths.

(Supplementary Note 19)

The power control method according to any of supplementary notes 15 to 18, further comprising setting an upper limit value of the power consumption of the first device or the second device to a value of electric energy available from another one of the first power paths or another one of the second power paths.

(Supplementary Note 20)

A power control device of a power supply system, the power supply system including two first power paths for supplying electric power to a first device and two second power paths for supplying electric power to a second device, wherein the power control device switches a destination of power supply by one of the first power paths to either the first device or the second device, and switches a destination of power supply by one of the second power paths to either the second device or the first device.

(Supplementary Note 21)

The power control device according to supplementary note 20, wherein the power control device switches the destination of the power supply by the one of the first power paths and the one of the second power path, based on power consumption of at least one of the first device and the second device.

(Supplementary Note 22)

A non-transitory computer-readable medium storing a program comprising instructions for causing a power control device of a power supply system to perform, the power supply system including two first power paths for supplying electric power to a first device and two second power paths for supplying electric power to a second device, a process of switching a destination of power supply by one of the first power paths to either the first device or the second device, and switching a destination of power supply by one of the second power paths to either the second device or the first device.

(Supplementary Note 23)

The non-transitory computer-readable medium storing the program according to supplementary note 22, the program further comprising instructions for causing the power control device to perform a process of switching the destination of the power supply by the one of the first power paths and the one of the second power path, based on power consumption of at least one of the first device and the second device.

It should be noted that the program described above may be stored in a storage device or stored on a computer-readable storage medium. The storage medium is a portable medium such as a flexible disk, an optical disk, a magneto-optical disk, or a semiconductor memory, for example.

While the present invention has been described with reference to the exemplary embodiments described above, the present invention is not limited to the above-described embodiments. The form and details of the present invention can be changed within the scope of the present invention in various manners that can be understood by those skilled in the art.

REFERENCE SIGNS LIST 10 server A
10 switch-equipped power feeder module for server A
10b power feeder module for server A
11 motherboard
12 BMC
13 loading device
14 switch
14a, 14b switching circuit
15 controller
16 power sensor
17 capacitor
18 power sensor
20 server B
20a switch-equipped power feeder module for server B
20b power feeder module for server B
21 motherboard
22 BMC
23 loading device
24 switch
24a, 24b switching circuit
30 bus bar
31, 32, 33, 34, 35 power feeder cable
40 LAN switch
41 LAN cable
50 central power source
100 first device
101, 102 first power path
200 second device
201, 202 second power path

The invention claimed is:

1. A power supply system comprising:
only two first power paths connected to a first device, the two first power path supplying electric power to the first device; and
only two second power paths connected to a second device, the two second power path supplying electric power to the second device, wherein
one of the first power paths is configured to be able to constantly supply electric power to the first device or the second device,
another one of the first power paths is configured to be able to constantly supply electric power to the first device,
one of the second power paths is configured to be able to constantly supply electric power to the second device or the first device, and
another one of the second power paths is configured to be able to constantly supply electric power to the second device.

2. The power supply system according to claim 1, further comprising a switch for switching a destination of power supply by the one of the first power paths to either the first device or the second device, and switching a destination of power supply by the one of the second power paths to either the second device or the first device.

3. The power supply system according to claim 2, wherein the switch switches a state between a state in which the destination of the power supply by the one of the first power paths is set to the first device and the destination of the power supply by the one of the second power paths is set to the second device, and a state in which the destination of the power supply by the one of the first power paths and the one of the second power paths is set to either the first device or the second device.

4. The power supply system according to claim 2, further comprising a control device that controls operation of the switch to switch the destination of the power supply by the one of the first power paths and the one of the second power path, based on power consumption of at least one of the first device and the second device.

5. The power supply system according to claim 4, wherein in a state in which the destination of the power supply by the one of the first power paths is the first device and the destination of the power supply by the one of the second power paths is the second device, when the power consumption of the first device or the second device exceeds electric energy available from the two first power paths or the two second power paths, the control device controls the operation of the switch to switch the destination of the power supply by the one of the first power paths and the one of the second power paths to either the first device or the second device.

6. The power supply system according to claim 4, wherein in a state in which the destination of the power supply by the one of the first power paths and the one of the second power paths is either the first device or the second device, when the power consumption of the first device or the second device becomes lower than electric energy available from the two first power paths or the two second power paths, the control device controls the operation of the switch to switch the destination of the power supply by the one of the first power paths to the first device and switch the destination of the power supply by the one of the second power paths to the second device.

7. The power supply system according to claim 4, wherein the control device sets an upper limit value of the power consumption of at least one of the first device and the second device such that total power consumption of the first device and the second device does not exceed electric energy available from the two first power paths and the two second power paths.

8. The power supply system according to claim 4, wherein the control device sets an upper limit value of the power consumption of the first device or the second device to a value of electric energy available from another one of the first power paths or another one of the second power paths.

* * * * *